United States Patent
Hirano et al.

(10) Patent No.: US 11,084,103 B2
(45) Date of Patent: Aug. 10, 2021

(54) COATED CUTTING TOOL

(71) Applicant: TUNGALOY CORPORATION, Fukushima (JP)

(72) Inventors: Yusuke Hirano, Iwaki (JP); Shigeki Tanaka, Iwaki (JP)

(73) Assignee: TUNGALOY CORPORATION, Fukushima (JP)

( * ) Notice: Subject to any disclaimer, the term of this patent is extended or adjusted under 35 U.S.C. 154(b) by 656 days.

(21) Appl. No.: 15/765,955

(22) PCT Filed: Sep. 29, 2016

(86) PCT No.: PCT/JP2016/078875
§ 371 (c)(1),
(2) Date: Apr. 4, 2018

(87) PCT Pub. No.: WO2017/061325
PCT Pub. Date: Apr. 13, 2017

(65) Prior Publication Data
US 2018/0281078 A1      Oct. 4, 2018

(30) Foreign Application Priority Data

Oct. 7, 2015   (JP) .............................. JP2015-199247

(51) Int. Cl.
*B23B 27/14*      (2006.01)
*C04B 41/00*      (2006.01)
(Continued)

(52) U.S. Cl.
CPC ............ *B23B 27/148* (2013.01); *B23B 27/14* (2013.01); *B23B 51/00* (2013.01); *B23C 5/16* (2013.01);
(Continued)

(58) Field of Classification Search
CPC ... B23B 27/18; B23B 27/148; B23B 2222/28; B23B 2224/08; B23B 51/00; B23C 5/16;
(Continued)

(56) References Cited

U.S. PATENT DOCUMENTS

2012/0090247 A1 *   4/2012   Miura ..................... C04B 41/52
                                                                      51/309

FOREIGN PATENT DOCUMENTS

JP      H08-168904 A      7/1996
JP      2000-334606 A     12/2000
(Continued)

OTHER PUBLICATIONS

Kondou et al, JP2007105839A (English Translation), Apr. 26, 2007, JPO/Google, pp. 1-10 (Year: 2007).*

(Continued)

*Primary Examiner* — Maria V Ewald
*Assistant Examiner* — Ethan Weydemeyer
(74) *Attorney, Agent, or Firm* — Studebaker & Brackett PC

(57) ABSTRACT

A coated cutting tool comprising a substrate and a coating layer formed on a surface of the substrate, the coating layer including an alternating laminate structure in which two or more compound layers of each of two or three or more kinds, each kind having a different composition, are laminated in an alternating manner, wherein:
the alternating laminate structure is constituted by:
a compound layer containing a compound having a composition represented by formula (1) below:

$$(Ti_xM_ySi_z)N \qquad (1)$$

[wherein M denotes an element of at least one kind selected from the group consisting of Zr, Hf, V, Nb, Ta, Cr, Mo, W
(Continued)

and Al, x denotes an atomic ratio of Ti based on a total of Ti, an element denoted by M and Si, y denotes an atomic ratio of the element denoted by M based on a total of Ti, the element denoted by M and Si, z denotes an atomic ratio of Si based on a total of Ti, the element denoted by M and Si, x satisfies $0.20 \leq x \leq 0.50$, y satisfies $0.20 \leq y \leq 0.50$, z satisfies $0.03 \leq z \leq 0.30$, and x, y and z satisfy $x+y+z=1$]; and a compound layer containing a compound having a composition represented by formula (2) below:

$$(Ti_a M_b Si_c)N \qquad (2)$$

[wherein M denotes an element of at least one kind selected from the group consisting of Zr, Hf, V, Nb, Ta, Cr, Mo, W and Al, a denotes an atomic ratio of Ti based on a total of Ti, an element denoted by M and Si, b denotes an atomic ratio of the element denoted by M based on a total of Ti, the element denoted by M and Si, c denotes an atomic ratio of Si based on a total of Ti, the element denoted by M and Si, a satisfies $0.20 \leq a \leq 0.49$, b satisfies $0.21 \leq b \leq 0.50$, c satisfies $0.04 \leq c \leq 0.30$, and a, b and c satisfy $a+b+c=1$];

an absolute value of a difference between an amount of a specific metal element contained in a compound layer which constitutes the alternating laminate structure based on an amount of all the metal elements contained therein and an amount of the specific metal element contained in another compound layer which is adjacent to the compound layer and which constitutes the alternating laminate structure based on an amount of all the metal elements contained therein, is more than 0 atom % and less than 5 atom %; and an average thickness of each of the compound layers is from 1 nm or more to 50 nm or less, and an average thickness of the alternating laminate structure is from 1.0 µm or more to 15.0 µm or less.

14 Claims, 1 Drawing Sheet

(51) Int. Cl.
| | | |
|---|---|---|
| *C04B 41/52* | (2006.01) | |
| *C04B 41/50* | (2006.01) | |
| *B23B 51/00* | (2006.01) | |
| *B23C 5/16* | (2006.01) | |
| *C04B 41/87* | (2006.01) | |
| *C23C 28/04* | (2006.01) | |
| *C23C 28/00* | (2006.01) | |
| *C23C 14/06* | (2006.01) | |
| *C23C 14/32* | (2006.01) | |
| *C23C 30/00* | (2006.01) | |

(52) U.S. Cl.
CPC ........ *C04B 41/009* (2013.01); *C04B 41/5063* (2013.01); *C04B 41/5068* (2013.01); *C04B 41/52* (2013.01); *C04B 41/87* (2013.01); *C23C 14/0641* (2013.01); *C23C 14/325* (2013.01); *C23C 28/04* (2013.01); *C23C 28/042* (2013.01); *C23C 28/044* (2013.01); *C23C 28/048* (2013.01); *C23C 28/40* (2013.01); *C23C 28/42* (2013.01); *C23C 30/005* (2013.01); *B23B 2222/28* (2013.01); *B23B 2224/08* (2013.01)

(58) Field of Classification Search
CPC ........ C04B 41/009; C04B 41/5063–52; C04B 41/87; C23C 14/0641; C23C 14/325; C23C 30/005
See application file for complete search history.

(56) References Cited

FOREIGN PATENT DOCUMENTS

| | | | |
|---|---|---|---|
| JP | 2000-334607 A | | 12/2000 |
| JP | 2007-105839 A | | 4/2007 |
| JP | 2008-264975 A | | 11/2008 |
| JP | 2008264975 A | * | 11/2008 |
| JP | 2009-061520 A | | 3/2009 |
| JP | 2009061520 A | * | 3/2009 |
| JP | 2011-224716 A | | 11/2011 |
| WO | 2010/150335 A1 | | 12/2010 |

OTHER PUBLICATIONS

International Search Report issued in PCT/JP2016/078875; dated Dec. 20, 2016.
International Preliminary Report on Patentability and Written Opinion issued in PCT/JP2016/078875; dated Apr. 10, 2018.

* cited by examiner

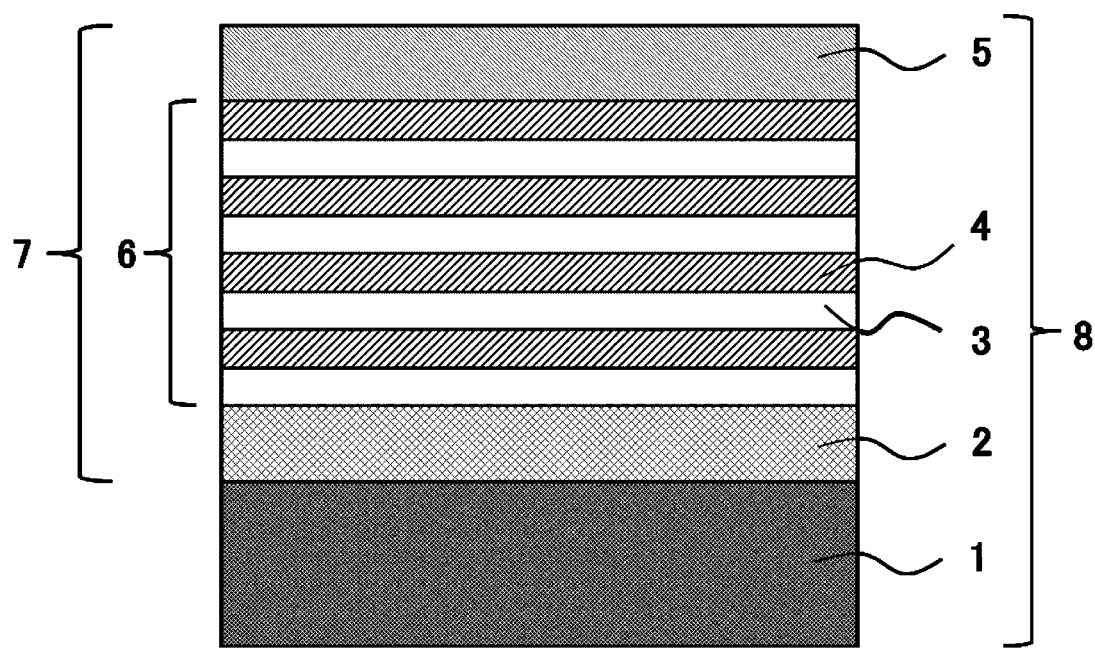

COATED CUTTING TOOL

TECHNICAL FIELD

The present invention relates to a coated cutting tool.

BACKGROUND ART

In recent years, a cutting tool having a longer tool life than in the case of a conventional cutting tool has been required, along with the improvement of highly efficient cutting. Thus, in terms of the performance required for tool materials, improvements of wear resistance and fracture resistance, which are directly related to the tool life, have been becoming increasingly important. In view of this, in order to improve such characteristics, a coated cutting tool is widely used which includes: a substrate comprised of a cemented carbide, cermet, cBN or the like; and a coating layer provided on a surface of the substrate, the coating layer consisting of one layer or two or more layers each comprised of a TiN layer, a TiAlN layer or the like.

Various techniques have been proposed in order to improve the characteristics of the above-described coating layer. For example, Patent Document 1 proposes a coated cutting tool in which a composite nitride of Ti and Al, which has a ratio of Ti/Al that falls within a range of from 20/80 or more to 60/40 or less, is formed on a surface of a substrate.

Patent Documents 2 and 3 each propose a coating film comprising an alternating laminate of: layers each containing a Ti nitride, a Ti carbonitride, a Ti oxynitride or a Ti carboxynitride with an appropriate amount of Si; and layers each consisting of a nitride, a carbonitride, an oxynitride or a carboxynitride which contains Ti and Al as its main constituents.

CITATION LIST

Patent Documents

Patent Document 1: JPH08-168904 A
Patent document 2: JP2000-334606 A
Patent Document 3: JP2000-334607 A

SUMMARY

Technical Problem

While there has been a trend in which cutting conditions are severe, compared with the prior art, in order to increase machining efficiency, a longer tool life than so far is being demanded. However, in Patent Document 1 above, a single layer film having a large Al content has a problem in that the wear resistance is insufficient; meanwhile, a single layer film having a large Ti content has a problem of being inferior in terms of crater wear resistance because such single layer film has excellent wear resistance but insufficient oxidation resistance.

A coating film, as disclosed in each of Patent Documents 2 and 3, in which TiSi-based layers, etc. are laminated in an alternating manner, has a high residual compressive stress, thereby leading to a problem in that peeling occurs after the formation of the coating film or chipping is prone to occur in cutting.

The present invention has been made in order to solve the above problems, and an object of the present invention is to provide a coated cutting tool which has excellent wear resistance and fracture resistance, particularly in high-speed and high-feed machining, and allows for satisfactory machining over a long period of time.

Solution to Problem

The present inventor has conducted studies regarding the extension of the tool life of a coated cutting tool and has accordingly found that the following configurations of a coated cutting tool allow the wear resistance and fracture resistance thereof to be improved, and found that, as a result, the tool life of the coated cutting tool can be extended, and this has led to the completion of the present invention.

Namely, the gist of the present invention is as set forth below.

[1] A coated cutting tool comprising a substrate and a coating layer formed on a surface of the substrate, the coating layer including an alternating laminate structure in which two or more compound layers of each of two or three or more kinds, each kind having a different composition, are laminated in an alternating manner, wherein:

the alternating laminate structure is constituted by:

a compound layer containing a compound having a composition represented by formula (1) below:

$$(Ti_xM_ySi_z)N \qquad (1)$$

[wherein M denotes an element of at least one kind selected from the group consisting of Zr, Hf, V, Nb, Ta, Cr, Mo, W and Al, x denotes an atomic ratio of Ti based on a total of Ti, an element denoted by M and Si, y denotes an atomic ratio of the element denoted by M based on a total of Ti, the element denoted by M and Si, z denotes an atomic ratio of Si based on a total of Ti, the element denoted by M and Si, x satisfies $0.20 \leq x \leq 0.50$, y satisfies $0.20 \leq y \leq 0.50$, z satisfies $0.03 \leq z \leq 0.30$, and x, y and z satisfy $x+y+z=1$]; and a compound layer containing a compound having a composition represented by formula (2) below:

$$(Ti_aM_bSi_c)N \qquad (2)$$

[wherein M denotes an element of at least one kind selected from the group consisting of Zr, Hf, V, Nb, Ta, Cr, Mo, W and Al, a denotes an atomic ratio of Ti based on a total of Ti, an element denoted by M and Si, b denotes an atomic ratio of the element denoted by M based on a total of Ti, the element denoted by M and Si, c denotes an atomic ratio of Si based on a total of Ti, the element denoted by M and Si, a satisfies $0.20 \leq a \leq 0.49$, b satisfies $0.21 \leq b \leq 0.50$, c satisfies $0.04 \leq c \leq 0.30$, and a, b and c satisfy $a+b+c=1$];

an absolute value of a difference between an amount of a specific metal element contained in a compound layer which constitutes the alternating laminate structure based on an amount of all the metal elements contained therein and an amount of the specific metal element contained in another compound layer which is adjacent to the compound layer and which constitutes the alternating laminate structure based on an amount of all the metal elements contained therein, is more than 0 atom % and less than 5 atom %; and an average thickness of each of the compound layers is from 1 nm or more to 50 nm or less, and an average thickness of the alternating laminate structure is from 1.0 μm or more to 15.0 μm or less.

[2] The coated cutting tool according to [1], wherein an absolute value of a difference between an amount of a specific metal element contained in the compound layer which constitutes the alternating laminate structure based on an amount of all the metal elements contained therein and an amount of the specific metal element contained in the other compound layer which is adjacent to the compound layer and which constitutes the alternating laminate structure based on an amount of all the metal elements contained therein, is from 1 atom % or higher to 4 atom % or lower.

[3] The coated cutting tool according to [1] or [2], wherein: the coated cutting tool includes a cutting edge in an intersecting edge between a rake surface and a flank; and when regarding a Ti content, on an atom basis, of the alternating laminate structure in the rake surface as being denoted by $Ti_r$, and regarding a Ti content, on an atom basis, of the alternating laminate structure in the flank as being denoted by $Ti_f$, a ratio of $Ti_f$ to $Ti_r$, $[Ti_f/Ti_r]$ is from 1.05 or more to 1.20 or less.

[4] The coated cutting tool according to any one of [1] to [3], wherein: the coating layer includes a lower layer between the substrate and the alternating laminate structure; the lower layer is comprised of a single layer or a laminate of a compound of: an element of at least one kind selected from the group consisting of Ti, Zr, Hf, V, Nb, Ta, Cr, Mo, W, Al, Si and Y; and an element of at least one kind selected from the group consisting of C, N, O and B; and an average thickness of the lower layer is from 0.1 μm or more to 3.5 μm or less.

[5] The coated cutting tool according to any one of [1] to [4], wherein: the coating layer includes an upper layer on a surface of the alternating laminate structure; the upper layer is comprised of a single layer or a laminate of a compound of: an element of at least one kind selected from the group consisting of Ti, Zr, Hf, V, Nb, Ta, Cr, Mo, W, Al, Si and Y; and an element of at least one kind selected from the group consisting of C, N, O and B; and an average thickness of the upper layer is from 0.1 μm or more to 3.5 μm or less.

[6] The coated cutting tool according to any one of [1] to [5], wherein an average thickness of the coating layer in its entirety is from 1.0 μm or more to 15 μm or less.

[7] The coated cutting tool according to any one of [1] to [6], wherein the substrate is a cemented carbide, cermet, ceramics or a cubic boron nitride sintered body.

Advantageous Effects of Invention

The coated cutting tool of the present invention has excellent wear resistance and fracture resistance, particularly in high-speed and high-feed machining, and therefore provides the effect of allowing for satisfactory machining over a long period of time.

BRIEF DESCRIPTION OF DRAWINGS

FIG. 1 is a schematic view showing an example of a coated cutting tool according to the present invention.

DESCRIPTION OF EMBODIMENTS

An embodiment for carrying out the present invention (hereinafter simply referred to as the "present embodiment") will hereinafter be described in detail, with reference to the attached drawings as appropriate. However, the present invention is not limited to the present embodiment below. Various modifications may be made to the present invention without departing from the gist of the invention. A coated cutting tool according to the present embodiment includes a substrate and a coating layer formed on a surface of the substrate. The substrate in the present embodiment is not particularly limited, as long as it may be used as a substrate for the coated cutting tool. Examples of the substrate include a cemented carbide, cermet, ceramic, a cubic boron nitride sintered body, a diamond sintered body and high-speed steel. From among the above examples, the substrate is further preferably comprised of any of a cemented carbide, cermet, ceramics and a cubic boron nitride sintered body because further excellent wear resistance and fracture resistance can be provided.

In the coated cutting tool of the present embodiment, a cutting edge is provided in an intersecting edge between a rake surface and a flank. Specific examples of types of the coated cutting tool include an indexable cutting insert for milling or turning, a drill and an end mill.

The coated cutting tool of the present embodiment shows the tendency of wear resistance to be further improved if the average thickness of the entire coating layer is 1.0 μm or more. Meanwhile, such coated cutting tool shows the tendency of fracture resistance to be further improved if the average thickness of the entire coating layer is 15 μm or less. Thus, the average thickness of the entire coating layer is preferably from 1.0 μm or more to 15 μm or less. In particular, from the same perspective as that set forth above, the average thickness of the entire coating layer is more preferably from 1.5 μm or more to 6.5 μm or less.

The coating layer of the present embodiment includes an alternating laminate structure in which two or more compound layers of each of two or three or more kinds, each kind having a different composition, are laminated in an alternating manner. If the coating layer includes such alternating laminate structure, this leads to an increased hardness of the coating layer, thereby resulting in an improvement of wear resistance. The alternating laminate structure of the present embodiment may be a structure in which two or more compound layers of each of two kinds, each kind having a different composition, are laminated in turn, or may be a structure in which two or more compound layers of each of three or more kinds, each having a different composition, are laminated in turn. In the specification, the term "having a different composition" means that, as to two compound layers, the difference between the amount (unit: atom %) of a specific metal element contained in one of the compound layers based on an amount of all the metal elements contained therein and the amount (unit: atom %) of the specific metal element contained in the other compound layer based on an amount of all the metal elements contained therein, is more than 0 atom %. The above "specific element" may be any of the metal elements contained in either of the compound layers, and a Si element is encompassed by a metal element.

One kind of the compound layers which constitute the alternating laminate structure of the present embodiment is a layer containing a compound having the composition represented by formula (1) below and is preferably comprised of a layer consisting of such compound.

$$(Ti_xM_ySi_z)N \qquad (1)$$

Herein, in formula (1), M denotes an element of at least one kind selected from the group consisting of Zr, Hf, V, Nb, Ta, Cr, Mo, W and Al, x denotes an atomic ratio of Ti based on a total of Ti, an element represented by M (hereinafter simply referred to as an "M element") and Si, y denotes an atomic ratio of the M element based on a total of Ti, the M element and Si, z denotes an atomic ratio of Si based on a total of Ti, the M element and Si, x satisfies 0.20≤x≤0.50, y satisfies 0.20≤y≤0.50, z satisfies 0.03≤z≤0.30, and x, y and z satisfy x+y+z=1. If the atomic ratio (x) of Ti in this compound layer of the present embodiment is 0.20 or more, this leads to a large Ti content, thereby allowing the reduction in wear resistance to be further suppressed, together with the effect based on an atomic ratio (a) of Ti in a compound layer having the composition represented by formula (2) below, whereas, if the atomic ratio (x) of Ti is 0.50 or less, this leads to a relatively increased content of the M element or Si, thereby allowing the reduction in oxidation resistance and heat resistance to be further suppressed, together with the effect based on the atomic ratio (a) of Ti in a compound layer having the composition represented by formula (2) below. If the atomic ratio (y) of the M element is 0.20 or more, this leads to a large content of the M element, thereby allowing the reduction in oxidation resistance and heat resistance to be further suppressed, together with the effect based on an atomic ratio (b) of the M element in a compound layer having the composition represented by formula (2) below, whereas, if the atomic ratio (y) of the M element is 0.50 or less, this leads to a relatively increased content of Ti, thereby allowing the reduction in abrasion resistance to be further suppressed, together with the effect based on the atomic ratio (b) of the M element in a compound layer having the composition represented by formula (2) below. If the atomic ratio (z) of Si is 0.03 or more, this leads to a large Si content, thereby allowing the reduction in oxidation resistance and heat resistance to be further suppressed, together with the effect based on an atomic ratio (c) of Si in a compound layer having the composition represented by formula (2) below, whereas, if the atomic ratio (z) of Si is 0.30 or less, this leads to a relatively increased content of Ti, thereby allowing the reduction in abrasion resistance to be further suppressed, together with the effect based on the atomic ratio (c) of Si in a compound layer having the composition represented by formula (2) below. From the same perspective, it is preferable that: x satisfies $0.24 \leq x \leq 0.50$; y satisfies $0.25 \leq y \leq 0.50$; and z satisfies $0.10 \leq z \leq 0.26$. Moreover, if the M element which constitutes the compound layer is at least one kind selected from the group consisting of Zr, Hf, V, Nb, Ta, Cr, Mo, W and Al, this improves oxidation resistance and wear resistance.

Further, another kind of the compound layers which constitute the alternating laminate structure of the present embodiment is a layer containing a compound having the composition represented by formula (2) below and is preferably comprised of a layer consisting of such compound.

$$(Ti_aM_bSi_c)N \quad (2)$$
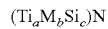

Herein, in formula (2), M denotes an element of at least one kind selected from the group consisting of Zr, Hf, V, Nb, Ta, Cr, Mo, W and Al, a denotes an atomic ratio of Ti based on a total of Ti, an M element and Si, b denotes an atomic ratio of the M element based on a total of Ti, the M element and Si, c denotes an atomic ratio of Si based on a total of Ti, the M element and Si, a satisfies $0.20 \leq a \leq 0.49$, b satisfies $0.21 \leq b \leq 0.50$, c satisfies $0.04 \leq c \leq 0.30$, and a, b and c satisfy $a+b+c=1$. If the atomic ratio (a) of Ti in this compound layer of the present embodiment is 0.20 or more, this leads to a large Ti content, thereby allowing the reduction in wear resistance to be further suppressed, together with the effect based on the atomic ratio (x) of Ti in a compound layer having the composition represented by formula (1) above, whereas, if the atomic ratio (a) of Ti is 0.50 or less, this leads to a relatively increased content of the M element or Si, thereby allowing the reduction in oxidation resistance and heat resistance to be further suppressed, together with the effect based on the atomic ratio (x) of Ti in a compound layer having the composition represented by formula (1) above. If the atomic ratio (b) of the M element is 0.21 or more, this leads to a large content of the M element, thereby allowing the reduction in oxidation resistance and heat resistance to be further suppressed, together with the effect based on the atomic ratio (y) of the M element in a compound layer having the composition represented by formula (1) above, whereas, if the atomic ratio (b) of the M element is 0.50 or less, this leads to a relatively increased content of Ti, thereby allowing the reduction in abrasion resistance to be further suppressed, together with the effect based on the atomic ratio (y) of the M element in a compound layer having the composition represented by formula (1) above. If the atomic ratio (c) of Si is 0.04 or more, this leads to a large Si content, thereby allowing the reduction in oxidation resistance and heat resistance to be further suppressed, together with the effect based on the atomic ratio (z) of Si in a compound layer having the composition represented by formula (1) above, whereas, if the atomic ratio (c) of Si is 0.30 or less, this leads to a relatively increased content of Ti, thereby allowing the reduction in abrasion resistance to be further suppressed, together with the effect based on the atomic ratio (z) of Si in a compound layer having the composition represented by formula (1) above. From the same perspective, it is preferable that: a satisfies $0.20 \leq a \leq 0.47$; b satisfies $0.25 \leq b \leq 0.50$; and c satisfies $0.08 \leq c \leq 0.30$. Moreover, if the M element which constitutes the compound layer is at least one kind selected from the group consisting of Zr, Hf, V, Nb, Ta, Cr, Mo, W, Al and Si, this improves oxidation resistance and wear resistance.

It is preferable that at least part of the kinds of the metal elements contained in a compound layer which constitutes the alternating laminate structure of the present embodiment is in common with another compound layer which constitutes the alternating laminate structure, and it is more preferable that all of the kinds of the metal elements contained in a compound layer which constitutes the alternating laminate structure of the present embodiment are in common with another compound layer which constitutes the alternating laminate structure. In other words, each of the plurality of compound layers which constitute the alternating laminate structure is more preferably constituted by the same kinds of metal elements. Further, the absolute value of the difference between the amount (unit: atom %) of a specific metal element contained in a compound layer which constitutes the alternating laminate structure based on the amount of all the metal elements contained therein and the amount (unit: atom %) of the specific metal element contained in another compound layer which is adjacent to the compound layer and which constitutes the alternating laminate structure based on the amount of all the metal elements contained therein (hereinafter also referred to as an "absolute value of a composition difference"), is more than 0 atom % and less than 5 atom %. That is, the absolute value of the difference between the ratio of a specific metal element contained in a compound layer which constitutes the alternating laminate structure and the ratio of the specific metal element contained in another compound layer which is adjacent to the compound layer and which constitutes the alternating laminate structure, is more than 0 atom % and less than 5 atom %. The "ratio of a specific metal element" refers to a ratio (unit:atom %) of the number of atoms of a specific metal element contained in a compound layer based on the number of atoms of all the metal elements contained in the compound layer. Further, a "specific metal element" may be at least one kind of the metal elements contained in a compound layer, but, with regard to each of the metal elements contained in the compound layer, the above absolute value preferably satisfies the above-described relationship.

Such configuration of the alternating laminate structure does not lead to a reduction in the adhesion between a compound layer which constitutes the alternating laminate structure and another compound layer which is adjacent to the compound layer, thereby resulting in a low degree of mismatching of crystal lattices in the interface between the two compound layers. Thus, the residual compressive stress of the alternating laminate structure can be prevented from being increased, and therefore, the peeling-off between layers of the alternating laminate structure can be suppressed, particularly in high-speed and high-feed machining. As a result, the fracture resistance of the coated cutting tool is improved. In particular, the absolute value of the difference between the ratio of a specific metal element contained in a compound layer which constitutes the alternating laminate structure and the ratio of the specific metal element contained in another compound layer which is adjacent to the compound layer and which constitutes the alternating laminate structure, is preferably from 1 atom % or higher to 4 atom % or lower. It should be noted that the feature in which the absolute value of the difference between the ratio of a specific metal element contained in a compound layer which constitutes the alternating laminate structure and the ratio of the specific metal element contained in another compound layer which is adjacent to the compound layer and which constitutes the alternating laminate structure, is 0 atom % indicates a single layer. A single layer has a hardness lower than that of the alternating laminate structure and is therefore inferior in wear resistance.

In the present embodiment, when the composition of a compound layer is represented by $(Ti_{0.45}Al_{0.40}Si_{0.15})N$, such representation indicates that: the atomic ratio of Ti based on a total of Ti, Al and Si is 0.45; the atomic ratio of Al based on a total of Ti, Al and Si is 0.40; and the atomic ratio of Si based on a total of Ti, Al and Si is 0.15. That is, such representation indicates that: the amount of Ti, being a specific metal element, based on the amount of all the metal elements, i.e., Ti, Al and Si, is 45 atom %; the amount of Al, being a specific metal element, based on the amount of all the metal elements, i.e., Ti, Al and Si, is 40 atom %; and the amount of Si, being a specific element, based on the amount of all the metal elements, i.e., Ti, Al and Si, is 15 atom %.

Regarding the above feature in which "the absolute value of the difference between the ratio of a specific metal element contained in a compound layer and the ratio of the specific metal element contained in another compound layer which is adjacent to the compound layer, is more than 0 atom % and less than 5 atom %," more detailed description will be made below. For example, when the alternating laminate structure is constituted by a $(Ti_{0.45}Al_{0.45}Si_{0.05})N$ layer and a $(Ti_{0.43}Al_{0.47}Si_{0.05})N$ layer, the two compound layers contain the same kinds of metal elements. This is because the two compound layers each contain Ti, Al and Si. In such case, the difference in the ratio of the number of atoms of Ti between the two compound layers is 2 atom %. Further, the difference in the ratio of the number of atoms of Al between the two compound layers is 2 atom %. These values are each less than 5 atom %. Therefore, this case satisfies the above condition that "the absolute value of the difference . . . is more than 0 atom % and less than 5 atom %."

Further, for example, when the alternating laminate structure is constituted by a $(Ti_{0.35}Al_{0.25}Cr_{0.25}Si_{0.15})N$ layer and a $(Ti_{0.37}Al_{0.22}Cr_{0.28}Si_{0.13})N$ layer, the two compound layers contain the same kinds of metal elements. This is because the two compound layers each contain Ti, Al, Cr and Si as metal elements. In such case, the difference in the ratio of the number of atoms of Ti between the two compound layers is 3 atom %. The difference in the ratio of the number of atoms of Al between the two compound layers is 3 atom %. Further, the difference in the ratio of the number of atoms of Cr between the two compound layers is 3 atom %. Moreover, the difference in the ratio of the number of atoms of Si between the two compound layers is 2 atom %. These values are each less than 5 atom %. Therefore, this case satisfies the above condition that "the absolute value of the difference . . . is more than 0 atom % and less than 5 atom %."

In the present embodiment, when one compound layer of each of two kinds, each kind having a different composition, is formed, the "number of repeats" is one. FIG. 1 is a schematic view showing an example of a cross-sectional structure of the coated cutting tool of the present invention, and this will be used below in order to describe the number of repeats. This coated cutting tool 8 includes a substrate 1 and a coating layer 7 formed on a surface of the substrate 1. The coating layer 7 is obtained by laminating a lower layer 2, which will be described below, an alternating laminate structure 6, and an upper layer 5, which will be described below, in order from the substrate 1 side. The alternating laminate structure 6 is obtained by laminating, in an alternating manner, respective compound layers, i.e., an A layer 3 and a B layer 4, whose composition is different from that of the A layer 3, in order from the lower layer 2 side to the upper layer 5 side, and the resulting laminate includes four A layers 3 and four B layers 4. In such case, the number of repeats is four. Further, for example, when forming five A layers 3 and five B layers 4, i.e., an A layer 3, a B layer 4, an A layer 3, a B layer 4, an A layer 3, a B layer 4, an A layer 3, a B layer 4, an A layer 3, a B layer 4, in order from the lower layer 2 side to the upper layer 5 side, the number of repeats is five. Herein, the A layer 3 may be a compound layer containing a compound having the composition represented by formula (1) above, and the B layer 4 may be a compound layer containing a compound having the composition represented by formula (2) above. Alternatively, the A layer 3 may be a compound layer containing a compound having the composition represented by formula (2) above, and the B layer 4 may be a compound layer containing a compound having the composition represented by formula (1) above. Although, in FIG. 1, the coating layer 7 includes both the lower layer 2 and the upper layer 5, the coating layer may instead include only either one of the lower layer 2 and the upper layer 5, or include neither of such two layers.

According to another aspect of the present embodiment, description will be simply made below regarding a coated cutting tool having an alternating laminate structure constituted by compound layers of three kinds, each having a different composition. In such coated cutting tool, the alternating laminate structure further includes, in addition to the above A layer and B layer, a C layer, being a compound layer, whose composition is different from those of the above compound layers. The A layer is regarded as being served by a compound layer containing a compound having the composition represented by formula (1) above, and the B layer is regarded as being served by a compound layer containing a compound having the composition represented by formula (2) above. In such case, the order of laminating between the A, B and C layers is not particularly limited, and, for example, any of the following orders from the substrate side may be employed: the order of an A layer, a B layer and a C layer; the order of a B layer, an A layer and a C layer; the order of an A layer, a C layer and a B layer; the order of a B layer, a C layer and an A layer; the order of a C layer, an A layer and a B layer; and the order of a C layer, a B layer and an A layer. The C layer is located between the A layer and the B layer, and thus, from the perspective of improving the adhesion between the A layer and the B layer, the C layer preferably contains a compound of: an element of at least one kind selected from the group consisting of Ti, Zr, Hf, V, Nb, Ta, Cr, Mo, W, Al, Si and Y; and an element of at least one kind selected from the group consisting of C, N, O and B. In particular, as to the C layer, it is preferable that at least part of the kinds of the metal elements contained therein is in common with one compound layer out of the A layer and the B layer, and it is more preferable that all the kinds of the metal elements contained therein are in common with one compound layer out of the A layer and the B layer. Further, the C layer preferably contains a specific metal element at a ratio between the ratio of the specific metal element contained in the A layer and the ratio of the specific metal element contained in the B layer. The above features allow for reduced mismatching of crystal lattices in the interface between adjacent compound layers without a reduction in the adhesion between such compound layers. Thus, the residual compressive stress of the alternating laminate structure can be prevented from being increased, whereby fracture resistance is improved, particularly in high-speed and high-feed machining.

Moreover, according to still another aspect of the present embodiment, an alternating laminate structure may include, in addition to the above A layer, B layer and C layer, another one kind or two or more kinds of compound layer(s) whose composition(s) is(are) different from those of the above compound layers. It should be noted, however, that, in the case of such alternating laminate structure, compound layers are preferably laminated such that the A layer and the B layer are adjacent to each other. The compound layers of the other one kind or two or more kinds whose composition(s) is(are) different from those of the A, B and C layers are layers each having a different composition, and such compound layers each preferably contain a compound of: an element of at least one kind selected from the group consisting of Ti, Zr, Hf, V, Nb, Ta, Cr, Mo, W, Al, Si and Y; and an element of at least one kind selected from the group consisting of C, N, O and B, from the perspective of improving the adhesion between the A layer, the B layer and the C layer. In such case, in particular, as to each of the compound layers other than the A layer and the B layer, it is preferable that at least part of the kinds of the metal elements contained therein is in common with one compound layer out of the A layer and the B layer, and it is more preferable that all the kinds of the metal elements contained therein are in common with one compound layer out of the A layer and the B layer. Further, each of the compound layers other than the A layer and the B layer preferably contains a specific metal element at a ratio between the ratio of the specific metal element contained in one of the two kinds of compound layers sandwiching such compound layer and the ratio of the specific element contained in the compound layer of the other kind. The above features allow for reduced mismatching of crystal lattices in the interface between adjacent compound layers without a reduction in the adhesion between such compound layers. Thus, the residual compressive stress of the alternating laminate structure can be prevented from being increased, whereby fracture resistance is improved, particularly in high-speed and high-feed machining.

In the present embodiment, if the average thickness of each of the compound layers which constitute the alternating laminate structure is 1 nm or more, it becomes easier to form compound layers each having a uniform thickness. Meanwhile, if the average thickness of each of the compound layers which constitute the alternating laminate structure is 50 nm or less, this leads to further increased hardness of the alternating laminate structure. Therefore, the average thickness of a compound layer which constitutes the alternating laminate structure is from 1 nm or more to 50 nm or less and is preferably from 2 nm or more to 50 nm or less.

In the present embodiment, if the average thickness of the alternating laminate structure is 1.0 μm or more, wear resistance is further improved, and, if such average thickness is 15 μm or less, fracture resistance is further improved. Thus, the average thickness of the alternating laminate structure is from 1.0 μm or more to 15 μm or less. In particular, the average thickness of the alternating laminate structure is preferably from 1.5 μm or more to 6.0 μm or less.

In the alternating laminate structure of the present embodiment, a Ti content, on an atom basis, of the alternating laminate structure in a rake surface is regarded as being denoted by $Ti_r$, and a Ti content, on an atom basis, of the alternating laminate structure in a flank is regarded as being denoted by $Ti_f$. As to the alternating laminate structure, a ratio of $Ti_f$ to $Ti_r$ [$Ti_f/Ti_r$] is preferably from 1.05 or more to 1.20 or less because this provides a more excellent balance between wear resistance and fracture resistance. If $Ti_f/Ti_r$ is 1.05 or more, the Ti content in the flank is large, and this allows the reduction in wear resistance to be further suppressed. Further, if $Ti_f/Ti_r$ is 1.05 or more, this indicates the tendency of the effect of reducing the internal stress of the alternating laminate structure in the rake surface to be increased. Meanwhile, a coated cutting tool with $Ti_f/Ti_r$ of 1.20 or less is preferred from the viewpoint of ease of manufacturing. Therefore, $Ti_f/Ti_r$ is preferably from 1.05 or more to 1.20 or less and is more preferably from 1.07 or more to 1.14 or less.

The coating layer of the present embodiment may be comprised of the alternating laminate structure alone. However, it is preferable for a lower layer to be provided between the substrate and the alternating laminate structure (i.e., located as a layer below the alternating laminate structure) because the adhesion between the substrate and the alternating laminate structure is further improved. In particular, the lower layer, from the same perspective as that set forth above, preferably contains a compound of: an element of at least one kind selected from the group consisting of Ti, Zr, Hf, V, Nb, Ta, Cr, Mo, W, Al, Si and Y; and an element of at least one kind selected from the group consisting of C, N, O and B, more preferably contains a compound of: an element of at least one kind selected from the group consisting of Ti and Al; and an element of at least one kind selected from the group consisting of C, N, O and B, and further preferably contains a compound of: an element of at least one kind selected from the group consisting of Ti and Al; and an N element. It should be noted, however, that the lower layer is different from the compound layers in the alternating laminate structure in terms of their respective compositions. Further, the lower layer may be comprised of a single layer or multiple layers of two or more layers.

In the present embodiment, the average thickness of the lower layer is preferably from 0.1 μm or more to 3.5 μm or less because this indicates the tendency of the adhesion between the substrate and the coating layer to be further improved. From the same perspective, the average thickness of the lower layer is more preferably from 0.1 μm or more to 3.0 μm or less and is further preferably from 0.1 μm or more to 2.5 μm or less.

The coating layer of the present embodiment may have an upper layer on a side of the alternating laminate structure which is opposite to the substrate (i.e., on a surface of the alternating laminate structure). The upper layer further preferably contains a compound of: an element of at least one kind selected from the group consisting of Ti, Zr, Hf, V, Nb, Ta, Cr, Mo, W, Al, Si and Y; and an element of at least one kind selected from the group consisting of C, N, O and B because further excellent wear resistance is achieved. Further, from the same perspective as that set forth above, the upper layer more preferably contains a compound of: an element of at least one kind selected from the group consisting of Ti, Nb, Cr and Al; and an element of at least one kind selected from the group consisting of C, N, O and B, and further preferably contains a compound of: an element of at least one kind selected from the group consisting of Ti, Nb, Cr and Al; and N. It should be noted, however, that the upper layer is different from the compound layers in the alternating laminate structure in terms of their respective compositions. Further, the upper layer may be comprised of a single layer or multiple layers of two or more layers.

In the present embodiment, the average thickness of the upper layer is preferably from 0.1 μm or more to 3.5 μm or less because this indicates the tendency of wear resistance to be excellent. From the same perspective, the average thickness of the upper layer is more preferably from 0.2 μm or more to 3.0 μm or less.

A method of manufacturing a coating layer in a coated cutting tool according to the present embodiment is not particularly limited. For example, a coating layer can be obtained by forming, in order, the compound layers in the above-described alternating laminate structure by a physical vapor deposition method, such as an ion plating method, an arc ion plating method, a sputtering method or an ion mixing method. In particular, a coating layer formed by the arc ion plating method has high adhesion with the substrate. Therefore, from among the above methods, the arc ion plating method is preferred.

A method of manufacturing a coated cutting tool according to the present embodiment will now be described using specific examples. It should be noted that the method of manufacturing a coated cutting tool according to the present embodiment is not particularly limited, as long as the configurations of the coated cutting tool may be achieved.

Firstly, a substrate processed in a tool shape is received in a reactor of a physical vapor deposition apparatus, and metal evaporation sources are placed in the reactor. Thereafter, the reactor is evacuated until the pressure therein becomes $1.0 \times 10^{-2}$ Pa or lower, and the substrate is heated, by a heater in the reactor, until the temperature reaches from 600° C. or higher to 700° C. or lower. After the heating, an argon (Ar) gas is introduced into the reactor so that the pressure therein is from 0.5 Pa or higher to 5.0 Pa or lower. In the Ar gas atmosphere with a pressure of from 0.5 Pa or higher to 5.0 Pa or lower, under the conditions that: a bias voltage of from −350 V or higher to −500 V or lower is applied to the substrate; and a current of from 40 A or higher to 50 A or lower is caused to flow through a tungsten filament in the reactor, an ion bombardment process is carried out, with the Ar gas, on a surface of the substrate. After the ion bombardment process is carried out on the substrate surface, the reactor is evacuated until the pressure therein reaches $1.0 \times 10^{-2}$ Pa or lower.

Then, the substrate is heated so as to have a temperature of from 250° C. or higher to 500° C. or lower by adjusting the temperature of the heater, and a nitrogen ($N_2$) gas and an Ar gas are then introduced into the reactor. Thereafter, the pressure in the reactor is set at from 2.0 Pa or higher to 4.0 Pa or lower, and a bias voltage of from −40 V or higher to −150 V or lower is applied to the substrate. Then, a metal evaporation source according to the metal components of each layer is evaporated via an arc discharge, whereby each layer can be formed on the substrate surface. At this time, two or more kinds of metal evaporation sources which are placed at positions separate from each other are simultaneously evaporated via an arc discharge while rotating a table to which the substrate is fixed, whereby each compound layer which constitutes an alternating laminate structure can be formed. In such case, by adjusting the number of revolutions of the rotating table to which the substrate in the reactor is fixed, the thickness of each compound layer which constitutes the alternating laminate structure can be controlled. Alternatively, the two or more kinds of metal evaporation sources are evaporated in an alternating manner via an arc discharge, whereby compound layers which constitute the alternating laminate structure can be formed. In such case, by adjusting the arc discharge time for each of the metal evaporation sources, the thickness of each compound layer which constitutes the alternating laminate structure can be controlled.

In order to set the ratio of $Ti_f$ to $Ti_r$ [$Ti_f/Ti_r$] in the alternating laminate structure of the present embodiment at a predetermined value, when forming the alternating laminate structure, adjustments may be made to the bias voltage and the mixing ratio of the $N_2$ gas and the Ar gas which are introduced into the reactor. More specifically, the application of a higher negative bias voltage (for example, −150 V is higher than −40 V) leads to a high Ti content of a surface facing the metal evaporation source and, on the other hand, leads to a low Ti content of a surface not facing the metal evaporation source. Further, as to the mixing ratio between the $N_2$ gas and the Ar gas which are introduced into the reactor, the formation of the alternating laminate structure with a high ratio of the Ar gas leads to a high Ti content of a surface facing the metal evaporation source. $Ti_f/Ti_r$ can be set at a predetermined value by placing the substrate such that a surface facing the metal evaporation source is served by a flank and by making adjustments to the bias voltage and the mixing ratio between the $N_2$ gas and the Ar gas which are introduced into the reactor.

The thickness of each layer which constitutes the coating layer in the coated cutting tool of the present embodiment can be measured, for example, from a cross-sectional structure of the coated cutting tool, using a transmission electron microscope (TEM). More specifically, in the coated cutting tool, the thickness of each layer is measured from each of the cross-sectional surfaces at three or more locations near the position 50 μm from the edge of a surface facing the metal evaporation source, toward the center of such surface. The arithmetic mean of the resulting thicknesses of the respective layers can be defined as an average thickness of the layers in the coated cutting tool.

The composition of each layer which constitutes the coating layer in the coated cutting tool of the present embodiment can be determined, from a cross-sectional structure of the coated cutting tool of the present embodiment, via measurements with the use of an energy-dispersive X-ray spectroscope (EDS), a wavelength-dispersive X-ray spectroscope (WDS), or the like.

The ratio of $Ti_f$ to $Ti_r$ [$Ti_f/Ti_r$] in the alternating laminate structure of the present embodiment can be obtained, from a cross-sectional structure of the coated cutting tool of the present embodiment, via measurements with the use of an EDS attached to a TEM. More specifically, the Ti content of each of the layers (for example, the A layers and B layers) which constitute the alternating laminate structure is measured near the position 50 μm from the edge of a flank, toward the center of such flank. It should be noted that the Ti content is measured from each of the cross-sectional surfaces at three or more locations per layer. If the coating layer includes A layers and B layers, the arithmetic mean of the Ti contents in the A layers and the B layers is regarded as being denoted by a Ti content $Ti_f$ of the alternating laminate structure. Similarly, a Ti content $Ti_r$ of the alternating laminate structure is measured near the position 50 μm from the edge of a rake surface, toward the center of such rake surface. The ratio of $Ti_f$ to $Ti_r$ [$Ti_f/Ti_r$] can be calculated from the obtained $Ti_f$ and $Ti_r$.

EXAMPLES

Although the present invention will be described in further detail below, with examples, the present invention is not limited to such examples.

Example 1

A machined cemented carbide insert with a shape of ISO certified SEEN1203AGTN and a composition of 93.0WC-7.0Co (mass %) was prepared as a substrate. In a reactor of an arc ion plating apparatus, a metal evaporation source was arranged so as to achieve the composition of each layer shown in each of Tables 1 and 2. The prepared substrate was fixed to a fixation fitting of a rotating table in the reactor. At this time, the substrate was placed such that a surface facing the metal evaporation source was served by a flank.

Thereafter, the reactor was evacuated such that the pressure therein reached $5.0 \times 10^{-3}$ Pa or lower. After the evacuation, the substrate was heated, by a heater in the reactor, until the temperature reached 600° C. After the heating, an Ar gas was introduced into the reactor such that the pressure therein was 5.0 Pa.

In the Ar gas atmosphere with a pressure of 5.0 Pa, under the conditions that: a bias voltage of −450 V was applied to the substrate; and a current of 45 A was caused to flow through a tungsten filament in the reactor, an ion bombardment process was carried out, with the Ar gas, on a surface of the substrate for 30 minutes. After the ion bombardment process, the reactor was evacuated until the pressure therein reached $5.0 \times 10^{-3}$ Pa or lower.

After the evacuation, the substrate was heated until the temperature thereof reached 400° C., an $N_2$ gas and an Ar gas were introduced into the reactor under the condition shown in each of Tables 3 and 4, and an adjustment was conducted such that the pressure therein became 3.0 Pa.

Next, as to invention samples 1 to 17 and comparative samples 1 to 9, the A layers and B layers shown in each of Tables 1 and 2 were formed in an alternating manner so as to obtain an alternating laminate structure. In further detail, a bias voltage was applied to the substrate under the condition shown in each of Tables 3 and 4, and the A layers and the B layers were formed in an alternating manner by simultaneously evaporating the metal evaporation source for the A layers and the metal evaporation source for the B layers via an arc discharge with an arc current of 120 A. At this time, the thickness of the A layer and the thickness of the B layer were controlled by adjusting the number of revolutions of the rotating table within a range of from 1 rpm or more to 5 rpm or less. It should be noted that the "absolute value of a composition difference" in each of the tables refers to the "absolute value of a composition difference" between an A layer and a B layer (the same shall apply hereinafter).

Meanwhile, as to comparative sample 10, a bias voltage of −50 V was applied to the substrate, and the metal evaporation source was evaporated via an arc discharge with an arc current of 120 A, whereby the single compound layer shown in Table 2 was formed.

After the formation of each layer with the predetermined average thickness shown in each of Tables 1 and 2 on the substrate surface, the heater was turned off, and the sample was taken out of the reactor after the temperature of the sample reached 100° C. or lower.

TABLE 1

| | Coating layer | | | | | |
|---|---|---|---|---|---|---|
| | Alternating laminate structure | | | | | |
| | A layer | | B layer | | Number | | Avg. thickness |
| Sample No. | Composition | Avg. thickness (nm) | Composition | Avg. thickness (nm) | of repeats (times) | Absolute value of composition difference (atm %) | of entire coating layer (μm) |
|---|---|---|---|---|---|---|---|
| Invention sample 1 | $(Ti_{0.45}Al_{0.45}Si_{0.10})N$ | 5 | $(Ti_{0.44}Al_{0.46}Si_{0.10})N$ | 5 | 300 | 1 | 3.00 |
| Invention sample 2 | $(Ti_{0.45}Al_{0.45}Si_{0.10})N$ | 5 | $(Ti_{0.42}Al_{0.48}Si_{0.10})N$ | 5 | 300 | 3 | 3.00 |
| Invention sample 3 | $(Ti_{0.45}Al_{0.45}Si_{0.10})N$ | 5 | $(Ti_{0.42}Al_{0.48}Si_{0.10})N$ | 5 | 150 | 3 | 1.50 |
| Invention sample 4 | $(Ti_{0.45}Al_{0.45}Si_{0.10})N$ | 5 | $(Ti_{0.42}Al_{0.48}Si_{0.10})N$ | 5 | 600 | 3 | 6.00 |
| Invention sample 5 | $(Ti_{0.45}Al_{0.45}Si_{0.10})N$ | 20 | $(Ti_{0.42}Al_{0.48}Si_{0.10})N$ | 20 | 75 | 3 | 3.00 |
| Invention sample 6 | $(Ti_{0.45}Al_{0.45}Si_{0.10})N$ | 50 | $(Ti_{0.42}Al_{0.48}Si_{0.10})N$ | 50 | 30 | 3 | 3.00 |
| Invention sample 7 | $(Ti_{0.45}Al_{0.45}Si_{0.10})N$ | 10 | $(Ti_{0.42}Al_{0.48}Si_{0.10})N$ | 5 | 200 | 3 | 3.00 |
| Invention sample 8 | $(Ti_{0.45}Zr_{0.35}Si_{0.20})N$ | 5 | $(Ti_{0.43}Zr_{0.37}Si_{0.20})N$ | 5 | 300 | 2 | 3.00 |
| Invention sample 9 | $(Ti_{0.24}Zr_{0.50}Si_{0.26})N$ | 5 | $(Ti_{0.20}Zr_{0.50}Si_{0.30})N$ | 5 | 300 | 4 | 3.00 |
| Invention sample 10 | $(Ti_{0.50}Al_{0.25}Si_{0.25})N$ | 5 | $(Ti_{0.46}Al_{0.25}Si_{0.29})N$ | 5 | 300 | 4 | 3.00 |
| Invention sample 11 | $(Ti_{0.45}Cr_{0.45}Si_{0.10})N$ | 4 | $(Ti_{0.42}Cr_{0.48}Si_{0.10})N$ | 4 | 375 | 3 | 3.00 |
| Invention sample 12 | $(Ti_{0.40}Cr_{0.35}Si_{0.25})N$ | 2 | $(Ti_{0.44}Cr_{0.31}Si_{0.25})N$ | 3 | 600 | 4 | 3.00 |
| Invention sample 13 | $(Ti_{0.45}W_{0.45}Si_{0.10})N$ | 2 | $(Ti_{0.45}W_{0.47}Si_{0.08})N$ | 3 | 2,500 | 2 | 12.50 |
| Invention sample 14 | $(Ti_{0.45}W_{0.25}Si_{0.30})N$ | 2 | $(Ti_{0.45}W_{0.28}Si_{0.27})N$ | 3 | 600 | 3 | 3.00 |
| Invention sample 15 | $(Ti_{0.45}Nb_{0.45}Si_{0.10})N$ | 5 | $(Ti_{0.42}Nb_{0.48}Si_{0.10})N$ | 5 | 300 | 3 | 3.00 |
| Invention sample 16 | $(Ti_{0.40}Nb_{0.35}Si_{0.25})N$ | 5 | $(Ti_{0.44}Nb_{0.31}Si_{0.25})N$ | 5 | 300 | 4 | 3.00 |
| Invention sample 17 | $(Ti_{0.45}Al_{0.25}Mo_{0.20}Si_{0.10})N$ | 5 | $(Ti_{0.42}Al_{0.25}Mo_{0.20}Si_{0.13})N$ | 5 | 300 | 3 | 3.00 |

TABLE 2

| | Coating layer | | | | | | |
|---|---|---|---|---|---|---|---|
| | Alternating laminate structure | | | | | | Avg. thickness of entire coating layer (μm) |
| | A layer | | B layer | | | | |
| Sample No. | Composition | Avg. thickness (nm) | Composition | Avg. thickness (nm) | Number of repeats (times) | Absolute value of composition difference (atm %) | |
| Comparative sample 1 | $(Ti_{0.45}Al_{0.45}Si_{0.10})N$ | 5 | $(Ti_{0.35}Al_{0.55}Si_{0.10})N$ | 5 | 300 | 10 | 3.00 |
| Comparative sample 2 | $(Ti_{0.45}Al_{0.45}Si_{0.10})N$ | 5 | $(Ti_{0.25}Al_{0.65}Si_{0.10})N$ | 5 | 300 | 20 | 3.00 |
| Comparative sample 3 | $(Ti_{0.45}Al_{0.45}Si_{0.10})N$ | 5 | TiN | 5 | 300 | 55 | 3.00 |
| Comparative sample 4 | $(Ti_{0.50}Al_{0.50})N$ | 5 | $(Ti_{0.46}Al_{0.54})N$ | 5 | 300 | 4 | 3.00 |
| Comparative sample 5 | $(Ti_{0.45}Al_{0.45}Si_{0.10})N$ | 100 | $(Ti_{0.42}Al_{0.48}Si_{0.10})N$ | 100 | 15 | 3 | 3.00 |
| Comparative sample 6 | $(Ti_{0.40}Cr_{0.35}Si_{0.25})N$ | 200 | $(Ti_{0.44}Cr_{0.31}Si_{0.25})N$ | 300 | 6 | 4 | 3.00 |
| Comparative sample 7 | $(Ti_{0.40}Cr_{0.20}Si_{0.40})N$ | 20 | $(Ti_{0.40}Cr_{0.24}Si_{0.36})N$ | 20 | 75 | 4 | 3.00 |
| Comparative sample 8 | $(Ti_{0.15}Zr_{0.65}Si_{0.20})N$ | 20 | $(Ti_{0.18}Zr_{0.62}Si_{0.20})N$ | 20 | 75 | 3 | 3.00 |
| Comparative sample 9 | $(Al_{0.40}Cr_{0.45}Si_{0.15})N$ | 3 | $(Al_{0.38}Cr_{0.45}Si_{0.17})N$ | 3 | 500 | 2 | 3.00 |
| Comparative sample 10 | $(Ti_{0.50}Al_{0.50})N$, Single layer | | | | | | 3.00 |

TABLE 3

| Sample No. | Volume ratio between reaction gases (N₂:Ar) | Bias voltage (V) |
|---|---|---|
| Invention sample 1 | 3:7 | −40 |
| Invention sample 2 | 5:5 | −100 |
| Invention sample 3 | 7:3 | −120 |
| Invention sample 4 | 7:3 | −150 |
| Invention sample 5 | 5:5 | −60 |
| Invention sample 6 | 3:7 | −40 |
| Invention sample 7 | 7:3 | −120 |
| Invention sample 8 | 3:7 | −120 |
| Invention sample 9 | 10:0 | −40 |
| Invention sample 10 | 4:6 | −40 |
| Invention sample 11 | 5:5 | −60 |
| Invention sample 12 | 5:5 | −80 |
| Invention sample 13 | 6:4 | −40 |
| Invention sample 14 | 3:7 | −60 |
| Invention sample 15 | 7:3 | −150 |
| Invention sample 16 | 4:6 | −60 |
| Invention sample 17 | 7:3 | −100 |

TABLE 4

| Sample No. | Volume ratio between reaction gases (N₂:Ar) | Bias voltage (V) |
|---|---|---|
| Comparative sample 1 | 10:0 | −60 |
| Comparative sample 2 | 9:1 | −130 |
| Comparative sample 3 | 9:1 | −100 |
| Comparative sample 4 | 10:0 | −60 |
| Comparative sample 5 | 9:1 | −130 |
| Comparative sample 6 | 9:1 | −150 |
| Comparative sample 7 | 10:0 | −60 |
| Comparative sample 8 | 10:0 | −60 |
| Comparative sample 9 | 10:0 | −60 |
| Comparative sample 10 | 10:0 | −60 |

As to the average thickness of each layer of each of the obtained samples, such average thickness was obtained by: measuring the thickness of each layer via a TEM observation of each of the cross-sectional surfaces at three locations near the position 50 μm from the edge of a surface (flank) facing the metal evaporation source of the coated cutting tool, toward the center of such surface; and calculating the arithmetic mean of the resulting measurements. The composition of each layer of the obtained sample was measured from the cross-sectional surface near the position 50 μm from the edge of a surface (flank) facing the metal evaporation source of the coated cutting tool, toward the center of such surface, using an EDS. The measurement results are shown in Tables 1 and 2. It should be noted that the composition ratio of the metal elements of each layer in each of Tables 1 and 2 refers to an atomic ratio of each metal element based on all the metal elements in the compound which constitutes each layer. Further, the arithmetic mean of the Ti content of the A layer and the Ti content of the B layer (each of such Ti contents being on an atom basis) which were obtained here was regarded as being denoted by a Ti content $Ti_f$ of the alternating laminate structure in the flank. Similarly, as to the obtained coated cutting tools, a Ti content $Ti_r$ of the alternating laminate structure in a rake surface was obtained, using an EDS, from the value measured from the cross-sectional surface near the position 50 μm from the edge of the rake surface, toward the center of such surface. The arithmetic mean of the Ti content of the A layer and the Ti content of the B layer (each of such Ti contents being on an atom basis) was regarded as being denoted by $Ti_r$. The results of $Ti_f/Ti_r$ are shown in Tables 5 and 6.

TABLE 5

| Sample No. | Alternating laminate structure $Ti_f/Ti_r$ |
|---|---|
| Invention sample 1 | 1.05 |
| Invention sample 2 | 1.12 |
| Invention sample 3 | 1.18 |
| Invention sample 4 | 1.15 |
| Invention sample 5 | 1.10 |
| Invention sample 6 | 1.06 |
| Invention sample 7 | 1.17 |
| Invention sample 8 | 1.14 |
| Invention sample 9 | 1.00 |
| Invention sample 10 | 1.06 |
| Invention sample 11 | 1.08 |
| Invention sample 12 | 1.13 |
| Invention sample 13 | 1.00 |
| Invention sample 14 | 1.06 |
| Invention sample 15 | 1.20 |
| Invention sample 16 | 1.09 |
| Invention sample 17 | 1.15 |

TABLE 6

| Sample No. | Alternating laminate structure $Ti_f/Ti_r$ |
|---|---|
| Comparative sample 1 | 1.00 |
| Comparative sample 2 | 1.02 |
| Comparative sample 3 | 1.00 |
| Comparative sample 4 | 1.00 |
| Comparative sample 5 | 1.00 |
| Comparative sample 6 | 1.03 |
| Comparative sample 7 | 1.00 |
| Comparative sample 8 | 1.00 |
| Comparative sample 9 | Not contain Ti |
| Comparative sample 10 | 1.00* |

As to the "*" symbol in the table, $Ti_f/Ti_r$ was obtained with regard to a single layer with $(Ti_{0.50}Al_{0.50})N$.

Using the obtained samples, cutting tests 1 and 2 set forth below were conducted for performing evaluations on fracture resistance and wear resistance.

[Cutting Test 1: Wear Resistance Test]
Workpiece: SKD61
Workpiece shape: Rectangular parallelepiped of 100 mm×250 mm×100 mm
Cutting speed: 250 m/min
Feed: 0.25 mm/tooth
Depth of cut: 1.5 mm
Coolant: Not used
Evaluation items: A time when a sample had a flank wear width of 0.3 mm was defined as the end of the tool life, and the machining length to reach the end of the tool life was measured.

[Cutting Test 2: Fracture Resistance Test]
Workpiece: SKD161
Workpiece shape: Rectangular parallelepiped of 100 mm×250 mm×100 mm
(The 100 mm×250 mm surface of the rectangular parallelepiped on which face milling was performed was provided with six holes each having a diameter of φ40 mm.)
Cutting speed: 200 m/min
Feed: 0.20 mm/tooth
Depth of cut: 2.0 mm
Coolant: Used
Evaluation items: A time when a sample was fractured (chipping occurred in the cutting edge of a sample) or had a flank wear width of 0.3 mm was defined as the end of the tool life, and the machining length to reach the end of the tool life was measured.

The results of the cutting tests are shown in Tables 7 and 8.

TABLE 7

| | Cutting test | |
|---|---|---|
| Sample No. | Wear resistance test Machining length (m) | Fracture resistance test Machining length (m) |
| Invention sample 1 | 14.4 | 6.6 |
| Invention sample 2 | 16.5 | 6.0 |
| Invention sample 3 | 8.5 | 4.8 |
| Invention sample 4 | 18.7 | 4.5 |
| Invention sample 5 | 15.8 | 5.9 |
| Invention sample 6 | 11.3 | 5.6 |
| Invention sample 7 | 17.2 | 6.5 |
| Invention sample 8 | 10.4 | 6.3 |
| Invention sample 9 | 9.1 | 6.0 |
| Invention sample 10 | 15.6 | 4.5 |
| Invention sample 11 | 15.5 | 5.8 |
| Invention sample 12 | 15.8 | 5.4 |
| Invention sample 13 | 17.1 | 4.0 |

TABLE 7-continued

| | Cutting test | |
|---|---|---|
| Sample No. | Wear resistance test Machining length (m) | Fracture resistance test Machining length (m) |
| Invention sample 14 | 16.2 | 5.0 |
| Invention sample 15 | 12.4 | 6.1 |
| Invention sample 16 | 12.8 | 5.9 |
| Invention sample 17 | 15.3 | 6.4 |

TABLE 8

| | Cutting test | |
|---|---|---|
| Sample No. | Wear resistance test Machining length (m) | Fracture resistance test Machining length (m) |
| Comparative sample 1 | 7.5 | 3.0 |
| Comparative sample 2 | 7.2 | 2.4 |
| Comparative sample 3 | 6.8 | 1.8 |
| Comparative sample 4 | 4.2 | 2.2 |
| Comparative sample 5 | 3.5 | 2.0 |
| Comparative sample 6 | 3.0 | 1.5 |
| Comparative sample 7 | 8.5 | 2.8 |
| Comparative sample 8 | 2.4 | 3.2 |
| Comparative sample 9 | 2.2 | 2.8 |
| Comparative sample 10 | 2.8 | 1.2 |

As is apparent from the results of Tables 7 and 8, in the wear resistance test, the machining length of each invention sample was 8.5 m or more, whereas the machining length of each comparative sample was 8.5 m or less. Therefore, it is apparent that the wear resistance of each invention sample is equal to or better than that of each comparative sample. Further, in the fracture resistance test, the machining length of each invention sample was 4.0 m or more, whereas the machining length of each comparative sample was 3.2 m or less. Therefore, it is apparent that the fracture resistance of each invention sample is more excellent than that of each comparative sample. The above results indicate that each invention sample has excellent wear resistance and fracture resistance, thereby resulting in a longer tool life.

Example 2

A machined cemented carbide insert with a shape of ISO certified SEEN1203AGTN and a composition of 93.0WC-7.0Co (mass %) was prepared as a substrate. In a reactor of an arc ion plating apparatus, a metal evaporation source was arranged so as to achieve the composition of each layer shown in Table 9. The prepared substrate was fixed to a fixation fitting of a rotating table in the reactor.

Thereafter, the reactor was evacuated until the pressure therein became $5.0 \times 10^{-3}$ Pa or lower. After the evacuation, the substrate was heated, by a heater in the reactor, until the temperature reached 600° C. After the heating, an Ar gas was introduced into the reactor such that the pressure therein was 5.0 Pa.

In the Ar gas atmosphere with a pressure of 5.0 Pa, under the conditions that: a bias voltage of −450 V was applied to the substrate; and a current of 45 A was caused to flow through a tungsten filament in the reactor, an ion bombardment process was carried out, with the Ar gas, on a surface of the substrate for 30 minutes. After the ion bombardment process, the reactor was evacuated until the pressure therein became $5.0 \times 10^{-3}$ Pa or lower.

After the evacuation, the substrate was heated until the temperature thereof reached 400° C., an $N_2$ gas was introduced into the reactor, and an adjustment was conducted to achieve 3.0 Pa in the reactor.

Then, the lower layer was formed, as shown in Table 9, for each of invention samples 18 to 21. In further detail, a bias voltage of −50 V was applied to the substrate, and the metal evaporation source was evaporated via an arc discharge with an arc current of 120 A, whereby the lower layer was formed. After the formation of the lower layer, the reactor was evacuated until the pressure therein became $5.0 \times 10^{-3}$ Pa or lower.

After the evacuation, an $N_2$ gas and an Ar gas were introduced into the reactor under the condition shown in Table 10, and an adjustment was conducted to achieve 3.0 Pa in the reactor. Next, as to invention samples 18 to 21, the A layers and B layers shown in Table 9 were formed. In further detail, a bias voltage was applied to the substrate under the condition shown in Table 10, and the A layers and the B layers were formed in an alternating manner by simultaneously evaporating the metal evaporation source for the A layers and the metal evaporation source for the B layers via an arc discharge with an arc current of 120 A. At this time, the thickness of the A layer and the thickness of the B layer were controlled by adjusting the number of revolutions of the rotating table within a range of from 1 rpm or more to 5 rpm or less.

After the formation of the alternating laminate structure, the reactor was evacuated until the pressure therein became $5.0 \times 10^{-3}$ Pa or lower. After the evacuation, an $N_2$ gas was introduced into the reactor, and an adjustment was conducted to achieve 3.0 Pa in the reactor. Then, as to invention samples 18 to 21, a bias voltage of −50 V was applied to the substrate, and the metal evaporation source was evaporated via an arc discharge with an arc current of 120 A, whereby the upper layer shown in Table 9 was formed.

After the formation of each layer with the predetermined thickness shown in Table 9 on the substrate surface, the heater was turned off, and the sample was taken out of the reactor after the temperature of the sample reached 100° C. or lower.

TABLE 9

| | Coating layer | | | | | |
|---|---|---|---|---|---|---|
| | Lower layer | | Alternating laminate structure | | | |
| | | | A layer | | B layer | |
| Sample No. | Composition | Avg. thickness (μm) | Composition | Avg. thickness (nm) | Composition | Avg. thickness (nm) |
| Invention sample 18 | $(Ti_{0.50}Al_{0.50})N$ | 0.5 | $(Ti_{0.30}Hf_{0.45}Si_{0.25})N$ | 10 | $(Ti_{0.27}Hf_{0.48}Si_{0.25})N$ | 10 |
| Invention sample 19 | $(Al_{0.67}Ti_{0.33})N$ | 0.5 | $(Ti_{0.40}V_{0.35}Si_{0.25})N$ | 5 | $(Ti_{0.37}V_{0.38}Si_{0.25})N$ | 5 |
| Invention sample 20 | $(Al_{0.70}Ti_{0.30})N$ | 0.2 | $(Ti_{0.45}Ta_{0.30}Si_{0.25})N$ | 2 | $(Ti_{0.47}Ta_{0.28}Si_{0.25})N$ | 2 |
| Invention sample 21 | TiN | 0.1 | $(Ti_{0.45}Al_{0.45}Si_{0.10})N$ | 30 | $(Ti_{0.42}Al_{0.48}Si_{0.10})N$ | 30 |

| | Coating layer | | | | | |
|---|---|---|---|---|---|---|
| | Alternating laminate structure | | | | | |
| Sample No. | Number of repeats (times) | Absolute value of composition difference (atm %) | Avg. thickness of entire alternating laminate structure (μm) | Upper layer Composition | Avg. thickness (μm) | Avg. thickness of entire coating layer (μm) |
| Invention sample 18 | 120 | 3 | 2.40 | $(Al_{0.80}Nb_{0.20})N$ | 0.2 | 3.10 |
| Invention sample 19 | 220 | 3 | 2.20 | $(Al_{0.67}Ti_{0.33})N$ | 0.5 | 3.20 |
| Invention sample 20 | 600 | 2 | 2.40 | $(Al_{0.70}Ti_{0.30})N$ | 1 | 3.60 |
| Invention sample 21 | 50 | 3 | 3.00 | $(Al_{0.75}Cr_{0.25})N$ | 3 | 6.10 |

TABLE 10

| Sample No. | Volume ratio between reaction gases ($N_2$:Ar) | Bias voltage (V) |
|---|---|---|
| Invention sample 18 | 5:5 | −60 |
| Invention sample 19 | 4:6 | −40 |
| Invention sample 20 | 5:5 | −100 |
| Invention sample 21 | 9:1 | −150 |

As to the average thickness of each layer of each of the obtained samples, such average thickness was obtained by: measuring the thickness of each layer via a TEM observation of each of the cross-sectional surfaces at three locations near the position 50 μm from the edge of a surface (flank) facing the metal evaporation source of the coated cutting tool, toward the center of such surface; and calculating the arithmetic mean of the resulting measurements. The composition of each layer of the obtained sample was measured from the cross-sectional surface near the position at most 50 μm from the edge of a surface (flank) facing the metal evaporation source of the coated cutting tool, toward the center of such surface, using an EDS. The measurement results are shown in Table 9. It should be noted that the composition ratio of the metal elements of each layer in Table 9 refers to an atomic ratio of each metal element based on all the metal elements in the compound which constitutes each layer. Further, the arithmetic mean of the Ti content of the A layer and the Ti content of the B layer (each of such Ti contents being on an atom basis) which were obtained here was regarded as being denoted by a Ti content $Ti_f$ of the alternating laminate structure in the flank. Similarly, as to the obtained coated cutting tools, a Ti content $Ti_r$ of the alternating laminate structure in a rake surface was obtained from the cross-sectional surface near the position at most 50 μm from the edge of the rake surface, toward the center of such surface, according to the value measured using an EDS. The arithmetic mean of the Ti content of the A layer and the Ti content of the B layer (each of such Ti contents being on an atom basis) was regarded as being denoted by $Ti_r$. The results of $Ti_f/Ti_r$ are shown in Table 11.

TABLE 11

| Sample No. | Alternating laminate structure $Ti_f/Ti_r$ |
|---|---|
| Invention sample 18 | 1.09 |
| Invention sample 19 | 1.07 |
| Invention sample 20 | 1.14 |
| Invention sample 21 | 1.03 |

Using the obtained samples, the cutting test was conducted, as shown in Example 1, for performing evaluations. The results of the cutting test are shown in Table 12.

TABLE 12

| | Cutting test | |
|---|---|---|
| Sample No. | Wear resistance test Machining length (m) | Fracture resistance test Machining length (m) |
| Invention sample 18 | 9.5 | 5.9 |
| Invention sample 19 | 9.0 | 6.2 |
| Invention sample 20 | 12.6 | 6.3 |
| Invention sample 21 | 16.4 | 5.7 |

The results of Table 12 indicate that, in the wear resistance test, the machining length of each invention sample was 9.0 m or more, whereas the machining length of each comparative sample in Example 1 was 8.5 m or less. Therefore, it is apparent that the wear resistance of each invention sample is more excellent than that of each comparative sample. Further, in the fracture resistance test, the machining length of the fracture resistance test of each invention sample was 5.7 m or more, whereas the machining length of each comparative sample in Example 1 was 3.2 m or less. Therefore, it is apparent that the fracture resistance of each invention sample is more excellent than that of each comparative sample. In view of the above, it is apparent that the invention samples each have excellent wear resistance and fracture resistance and, in turn, involve a longer tool life, even if they each include the upper layer and the lower layer.

INDUSTRIAL APPLICABILITY

As to a coated cutting tool according to the present invention, such coated cutting tool has excellent wear resistance and fracture resistance, particularly in high-speed and high-feed machining, whereby the tool life can be extended more than that involved in the prior art, and the coated cutting tool therefore has high industrial applicability.

REFERENCE SIGNS LIST

1: Substrate, 2: Lower layer, 3: A layer, 4: B layer, 5: Upper layer, 6: Alternating laminate structure, 7: Coating layer, 8: Coated cutting tool.

What is claimed is:
1. A coated cutting tool comprising a substrate and a coating layer formed on a surface of the substrate, the coating layer including an alternating laminate structure in which two or more compound layers of each of two or three or more kinds, each kind having a different composition, are laminated in an alternating manner, wherein:
the alternating laminate structure is constituted by:
a compound layer containing a compound having a composition represented by formula (1) below:

$$(Ti_xM_ySi_z)N \qquad (1)$$

wherein M denotes an element of at least one kind selected from the group consisting of Zr, Hf, V, Nb, Ta, Cr, Mo, W and Al, x denotes an atomic ratio of Ti based on a total of Ti, an element denoted by M and Si, y denotes an atomic ratio of the element denoted by M based on a total of Ti, the element denoted by M and Si, z denotes an atomic ratio of Si based on a total of Ti, the element denoted by M and Si, x satisfies 0.20≤x≤0.50, y satisfies 0.20≤y≤0.50, z satisfies 0.03≤z≤0.30, and x, y and z satisfy x+y+z=1; and
a compound layer containing a compound having a composition represented by formula (2) below:

$$(Ti_aM_bSi_c)N \qquad (2)$$

wherein M denotes an element of at least one kind selected from the group consisting of Zr, Hf, V, Nb, Ta, Cr, Mo, W and Al, a denotes an atomic ratio of Ti based on a total of Ti, an element denoted by M and Si, b denotes an atomic ratio of the element denoted by M based on a total of Ti, the element denoted by M and Si, c denotes an atomic ratio of Si based on a total of Ti, the element denoted by M and Si, a satisfies 0.20≤a≤0.49, b satisfies 0.21≤b≤0.50, c satisfies 0.04≤c≤0.30, and a, b and c satisfy a+b+c=1;
an absolute value of a difference between an amount of a specific metal element from among the metal elements contained in a compound layer which constitutes the alternating laminate structure based on an amount of all the metal elements contained therein and an amount of the specific metal element from among the metal elements contained in another compound layer which is adjacent to the compound layer and which constitutes the alternating laminate structure based on an amount of all the metal elements contained therein, is 1 atom % or more and 4 atom % or less; and
an average thickness of each of the compound layers is from 1 nm or more to 50 nm or less, and an average thickness of the alternating laminate structure is from 1.0 μm or more to 15.0 μm or less.
2. The coated cutting tool according to claim 1, wherein:
the coated cutting tool includes a cutting edge in an intersecting edge between a rake surface and a flank; and
when regarding a Ti content, on an atom basis, of the alternating laminate structure in the rake surface as being denoted by $Ti_r$, and regarding a Ti content, on an atom basis, of the alternating laminate structure in the flank as being denoted by $Ti_f$, a ratio of $Ti_f$ to $Ti_r$, $[Ti_f/Ti_r]$ is from 1.05 or more to 1.20 or less.

3. The coated cutting tool according to claim 1, wherein:
the coating layer includes a lower layer between the substrate and the alternating laminate structure;
the lower layer is comprised of a single layer or a laminate of a compound of: an element of at least one kind selected from the group consisting of Ti, Zr, Hf, V, Nb, Ta, Cr, Mo, W, Al, Si and Y; and an element of at least one kind selected from the group consisting of C, N, O and B; and
an average thickness of the lower layer is from 0.1 μm or more to 3.5 μm or less.

4. The coated cutting tool according to claim 1, wherein:
the coating layer includes an upper layer on a surface of the alternating laminate structure;
the upper layer is comprised of a single layer or a laminate of a compound of: an element of at least one kind selected from the group consisting of Ti, Zr, Hf, V, Nb, Ta, Cr, Mo, W, Al, Si and Y; and an element of at least one kind selected from the group consisting of C, N, O and B; and
an average thickness of the upper layer is from 0.1 μm or more to 3.5 μm or less.

5. The coated cutting tool according to claim 1, wherein an average thickness of the coating layer in its entirety is from 1.0 μm or more to 15 μm or less.

6. The coated cutting tool according to claim 1, wherein the substrate is a cemented carbide, cermet, ceramics or a cubic boron nitride sintered body.

7. The coated cutting tool according to claim 2, wherein:
the coating layer includes a lower layer between the substrate and the alternating laminate structure;
the lower layer is comprised of a single layer or a laminate of a compound of: an element of at least one kind selected from the group consisting of Ti, Zr, Hf, V, Nb, Ta, Cr, Mo, W, Al, Si and Y; and an element of at least one kind selected from the group consisting of C, N, O and B; and
an average thickness of the lower layer is from 0.1 μm or more to 3.5 μm or less.

8. The coated cutting tool according to claim 2, wherein:
the coating layer includes an upper layer on a surface of the alternating laminate structure;
the upper layer is comprised of a single layer or a laminate of a compound of: an element of at least one kind selected from the group consisting of Ti, Zr, Hf, V, Nb, Ta, Cr, Mo, W, Al, Si and Y; and an element of at least one kind selected from the group consisting of C, N, O and B; and
an average thickness of the upper layer is from 0.1 μm or more to 3.5 μm or less.

9. The coated cutting tool according to claim 3, wherein:
the coating layer includes an upper layer on a surface of the alternating laminate structure;
the upper layer is comprised of a single layer or a laminate of a compound of: an element of at least one kind selected from the group consisting of Ti, Zr, Hf, V, Nb, Ta, Cr, Mo, W, Al, Si and Y; and an element of at least one kind selected from the group consisting of C, N, O and B; and
an average thickness of the upper layer is from 0.1 μm or more to 3.5 μm or less.

10. The coated cutting tool according to claim 2, wherein an average thickness of the coating layer in its entirety is from 1.0 μm or more to 15 μm or less.

11. The coated cutting tool according to claim 3, wherein an average thickness of the coating layer in its entirety is from 1.0 μm or more to 15 μm or less.

12. The coated cutting tool according to claim 4, wherein an average thickness of the coating layer in its entirety is from 1.0 μm or more to 15 μm or less.

13. The coated cutting tool according to claim 2, wherein the substrate is a cemented carbide, cermet, ceramics or a cubic boron nitride sintered body.

14. The coated cutting tool according to claim 3, wherein the substrate is a cemented carbide, cermet, ceramics or a cubic boron nitride sintered body.

* * * * *